(12) United States Patent
Chen et al.

(10) Patent No.: US 11,398,870 B2
(45) Date of Patent: Jul. 26, 2022

(54) SYSTEMS AND METHODS FOR OPTICAL DATA COMMUNICATION USING WIDE BANDGAP SEMICONDUCTOR DETECTORS

(71) Applicant: GE AVIATION SYSTEMS LLC, Grand Rapids, MI (US)

(72) Inventors: Cheng-Po Chen, Niskayuna, NY (US); Emad A. Andarawis, Ballston Lake, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 17/189,040

(22) Filed: Mar. 1, 2021

(65) Prior Publication Data

US 2021/0288722 A1 Sep. 16, 2021

Related U.S. Application Data

(60) Provisional application No. 62/989,234, filed on Mar. 13, 2020.

(51) Int. Cl.
*H04B 10/69* (2013.01)
*H04B 10/25* (2013.01)
*H04B 10/2581* (2013.01)

(52) U.S. Cl.
CPC ..... *H04B 10/6911* (2013.01); *H04B 10/2581* (2013.01); *H04B 10/25891* (2020.05)

(58) Field of Classification Search
CPC ............ H04B 10/6911; H04B 10/2581; H04B 10/25891; H04B 10/11; H04B 10/40; H04B 10/60; H01L 33/32; H01L 31/03044; H01L 31/03048; H01L 31/0312; H01L 31/167; H01L 25/167

USPC ........................................................ 398/143
See application file for complete search history.

(56) References Cited

U.S. PATENT DOCUMENTS

| 4,577,209 | A | 3/1986 | Forrest et al. |
| 5,796,883 | A * | 8/1998 | Hamamoto ......... G02B 6/4246 |
| | | | 257/E31.109 |
| 7,024,081 | B2 | 4/2006 | Dowd |
| 7,336,862 | B1 | 2/2008 | Xia |
| 8,035,822 | B2 | 10/2011 | Riza |
| 8,095,014 | B2 | 1/2012 | Erdos |
| 10,263,146 | B2 * | 4/2019 | Khatibzadeh ........ H04B 10/116 |

(Continued)

OTHER PUBLICATIONS

Goldstein, Jonathon et al.; "Harsh-Environment Fiber Optics for Aerospace"; https://www.photonics.com/Articles/Harsh-Environment_Fiber_Optics_for_Aerospace/a63730; Photonics Media; Sep. 2018; pp. 1-10.

(Continued)

*Primary Examiner* — Abbas H Alagheband
(74) *Attorney, Agent, or Firm* — Fitch, Even, Tabin & Flannery LLP (57) ABSTRACT

Systems and methods for optical data communication in high temperatures and harsh environments are provided herein. The embodiments utilize a combination of a short wavelength light source combined with a wide bandgap detector in order to transmit optical signals. An optical data communication system may include a light source connected to a light detector via an optical fiber. The light source and the light detector may also be physically adjacent to any dielectric gap that can be spanned without having an optical fiber intermediary.

15 Claims, 6 Drawing Sheets

(56) References Cited

U.S. PATENT DOCUMENTS

| | | | |
|---|---|---|---|
| 2002/0145776 A1* | 10/2002 | Chow | H04J 14/0241 |
| | | | 398/31 |
| 2004/0125844 A1* | 7/2004 | Ukita | B82Y 20/00 |
| | | | 372/45.013 |
| 2005/0053335 A1 | 3/2005 | Wipiejewski et al. | |
| 2006/0198571 A1* | 9/2006 | Allouche | H04B 10/40 |
| | | | 385/14 |
| 2006/0261876 A1* | 11/2006 | Agarwal | H01L 31/1113 |
| | | | 327/427 |
| 2009/0114013 A1* | 5/2009 | DiFoggio | G01V 7/04 |
| | | | 73/382 R |
| 2009/0261263 A1* | 10/2009 | Menge | G01V 5/04 |
| | | | 250/370.11 |
| 2009/0283748 A1 | 11/2009 | Csutak | |
| 2010/0314531 A1* | 12/2010 | Menge | G01T 1/208 |
| | | | 250/214.1 |
| 2011/0069958 A1 | 3/2011 | Haas | |
| 2011/0198499 A1* | 8/2011 | Park | H01L 31/1804 |
| | | | 250/332 |
| 2013/0342306 A1* | 12/2013 | Sampayan | H01C 1/00 |
| | | | 338/15 |
| 2016/0269114 A1* | 9/2016 | Beck | H04B 10/25891 |
| 2017/0051884 A1 | 2/2017 | Raring et al. | |
| 2018/0226247 A1* | 8/2018 | Chahal | H01L 21/02686 |
| 2019/0067900 A1* | 2/2019 | Bhattacharya | |
| | | | H01L 31/035236 |
| 2020/0233292 A1* | 7/2020 | Rudy | F21S 41/24 |
| 2020/0373723 A1* | 11/2020 | Sugime | G02B 6/4296 |

OTHER PUBLICATIONS

Howard, Courtney; "Making the connection in challenging environments"; https://www.intelligent-aerospace.com/commercial/article/16545262/making-the-connection-in-challenging-environments; Intelligent Aerospace; Apr. 11, 2018; pp. 1-23.

Pirich, Ronald et al.; "Fiber optics for harsh environments"; 2011 IEEE Long Island Systems, Applications and Technology Conference; IEEE; 2011; pp. 1-3.

* cited by examiner

SYSTEMS AND METHODS FOR OPTICAL DATA COMMUNICATION USING WIDE BANDGAP SEMICONDUCTOR DETECTORS

TECHNICAL FIELD

The technical field relates to optical data communication systems and methods for optical signal transmission in high temperatures and harsh environments.

BACKGROUND

There is an increasing need for communication systems that operate under high temperatures and harsh environments. Conventional data communication systems typically use electrical conductors (e.g., copper) and have significant mass associated with cabling. Cabling is susceptible to electromagnetic interference, lightning strike and damage to connected electronics. An alternative data communication system uses optical fibers instead of electrical conductors. Furthermore, known optical communication systems are designed around glass and/or polymeric (plastic) fibers and operate in relatively benign environments. Such traditional data communication systems are typically only capable of operating under low temperatures (e.g., temperatures under 125° C.) and generally ambient conditions.

Traditional systems may also use infrared (IR) devices that are unsuitable for use at temperatures exceeding 125° C. In addition, the materials and packaging (e.g., silicon) of such IR devices is not sustainable in high temperatures. Furthermore, at higher temperatures, IR devices typically experience low signal-to-noise-ratios. Accordingly, communication within the IR range may be burdensome in modulating light or distinguishing between light received and background electrons being generated that are not associated with the received light (e.g., dark current).

BRIEF DESCRIPTION

Certain embodiments commensurate in scope with the originally claimed disclosure are summarized below. These embodiments are not intended to limit the scope of the claimed disclosure, but rather these embodiments are intended only to provide a brief summary of possible forms of the disclosure. Indeed, embodiments may encompass a variety of forms that may be similar to or different from the embodiments set forth below.

Embodiments of the present disclosure are related to systems and methods for combining short wavelength optical signals and wide bandgap semiconductor electronics to enable optical communication in high temperatures and harsh environments. Short wavelength optical signals include blue light, ultraviolet (UV) light, and X-ray signals. Wide bandgap semiconductors include semiconductors whose bandgap is in the range of at or about 2-6 eV, and any range in between. Wide bandgap materials include, for example, silicon carbide (SiC), gallium nitride (GaN) and aluminum gallium nitride (AlGaN), and/or any combination thereof. High temperatures, referenced herein, may include temperatures at or above at least 125° C. (e.g., 250° C.+, 300° C.+). Further, harsh environments may include environments with high electrical noise and high electromagnetic interference (EMI). The embodiments herein are useful for harsh environments such as industrial applications, for example, applications using distributed control systems (e.g., aircrafts, satellites).

In an embodiment, an optical data communication system is provided comprising: a light source for emitting electromagnetic emissions; a transmission medium for transmitting the electromagnetic emissions from the light source; and a detector for detecting the electromagnetic emissions from the transmission medium. The light detector comprises a wide bandgap semiconductor material and/or component.

In an embodiment, a method of transmitting an optical signal in a high temperature environment is provided comprising the steps of encoding data into an optical signal that is emitted by an emitter; transmitting the optical signal to a detector via a transmission medium; and detecting the optical signal using a detector. The detector comprises one or more wide bandgap semiconductor materials and/or components.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
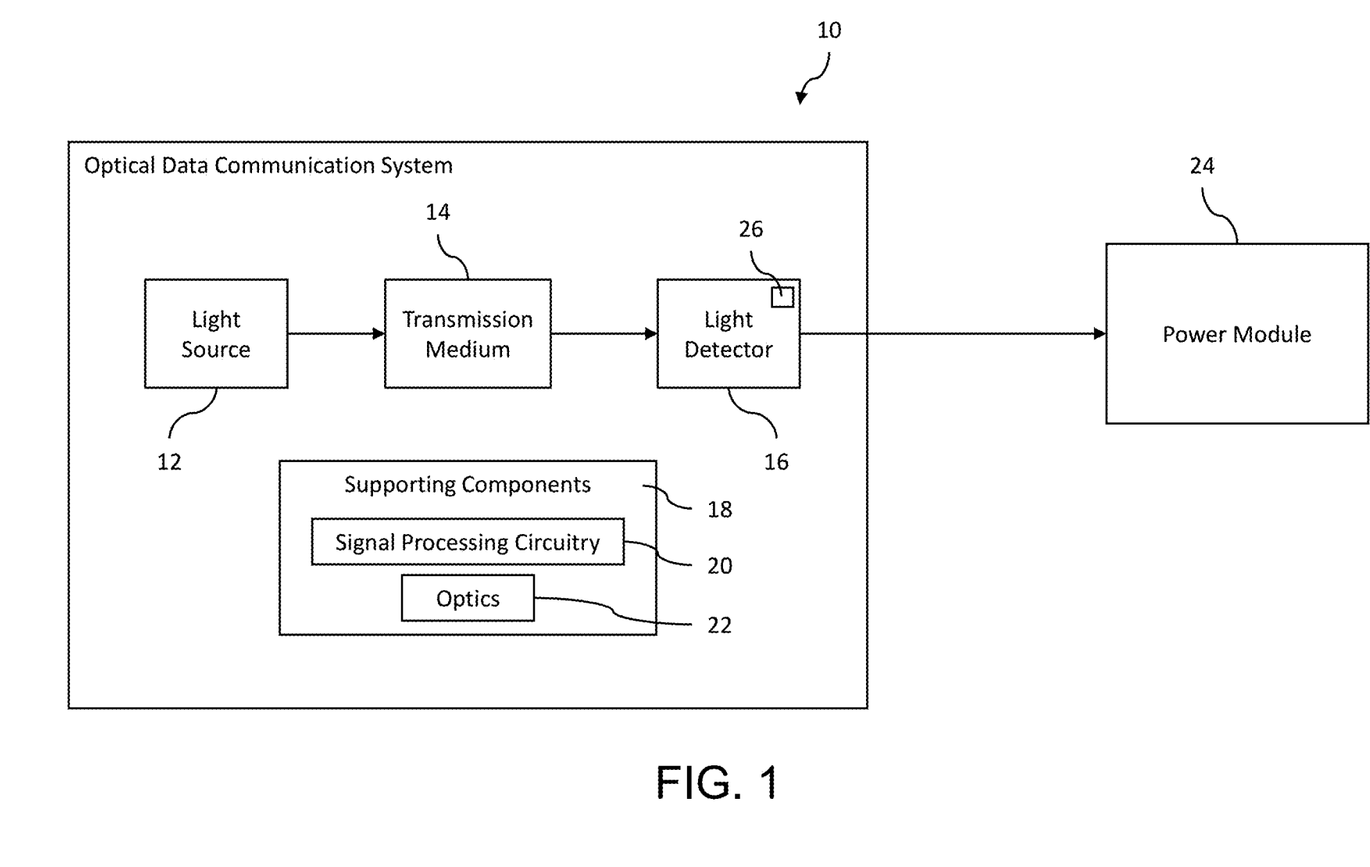
FIG. 1 is a block diagram of an overview of an optical data communication system, in accordance with some embodiments.

FIG. 1 is a block diagram of a simplified optical data communication system 10 according to embodiments herein. The optical data communication system 10 may include a light source 12 (e.g., optical device), a transmission medium 14 (e.g., optical fiber, optical coupling medium, optically transparent couplant or free space), a light detector 16 (e.g., wide bandgap semiconductor), and supporting components 18, each of which are capable of functioning in high temperatures and harsh environments. The light source 12 may also be formed of the same or a different wide bandgap semiconductor material or wide bandgap semiconductor component relative to the light detector 16. A wide bandgap semiconductor component, as described herein, does not require a discrete wide bandgap semiconductor device but could also be a wide bandgap semiconductor material alone. The light source 12 may also be referred to as a transmitter or an emitter. The light detector 16 may be referred to as a receiver. The optical data communication system 10 may operate, for example, in temperatures equal to or above at least 125° C. (e.g., 250° C., 300° C., or other relevant high temperatures) and/or in harsh environments (e.g., high noise and/or high EMI regions).

In an embodiment, the system 10 may include a plurality of light sources 12 and a plurality of detectors 16 that utilize a single fiber optic cable to create a multi-drop communication bus. Further, the system 10 may be configured to protect transmission of an optic signal from electromagnetic interference and lightening by eliminating a plurality of conducting paths between a plurality of nodes within a distributed system. For example, a plurality of nodes, may be, for example, smart components (e.g., sensors, actuators, or distributed control modules) on an aircraft engine. In such an application, one or more nodes may be capable of 2-way communications, and other nodes may be capable of only one way communication. The one or more of the plurality of nodes, may be configured to perform one-way or two way communication between a sensor and a central controller within an aircraft engine.

In an embodiment, the light source 12 and the detector 16 are galvanically isolated. The light source 12 and/or the light detector 16 of the optical data communication system 10 may each be fabricated from or composed of wide bandgap semiconductor materials or combinations of materials that can withstand high temperatures and operate at short wavelengths (e.g., blue light, ultraviolet (UV) light, and X-ray signals). The light source 12 encodes a message into an optical signal or electromagnetic emission, which is carried via the transmission medium 14 to the light detector 16. After receiving the optical signal, the light detector 16 may decode the message carried by the optical signal. The optical signal may also be amplified by the light detector 16 prior to decoding in two different ways. In one embodiment, the light detector 16 includes one or more optional amplifier circuits or components 26 for amplifying a signal after it is detected and before it is decoded. Alternatively, the light detector 16 may have a built in avalanche mode function that does not require a separate amplification circuit or component 26. This will be described in further detail below.

Figure 2:
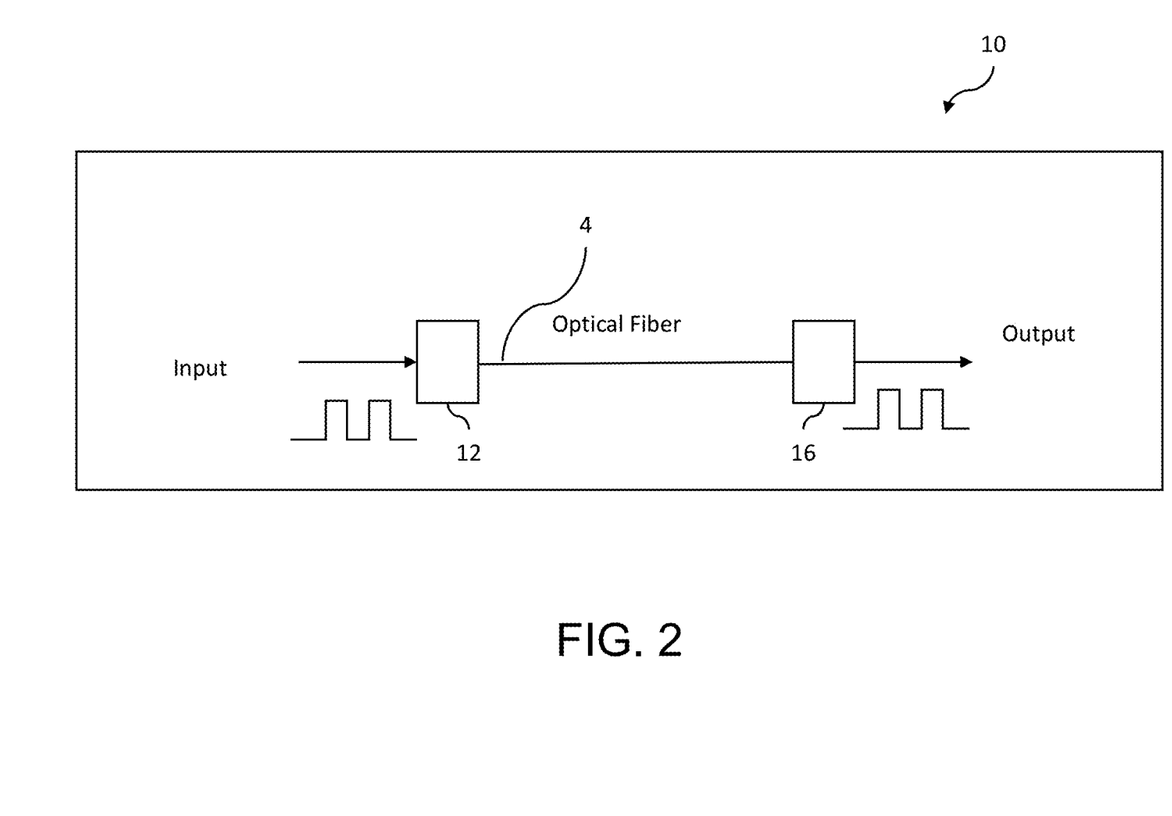
FIG. 2 is a block diagram of an embodiment of the optical communication system of FIG. 1, in which the transmission medium is an optical fiber.
Figure 3:
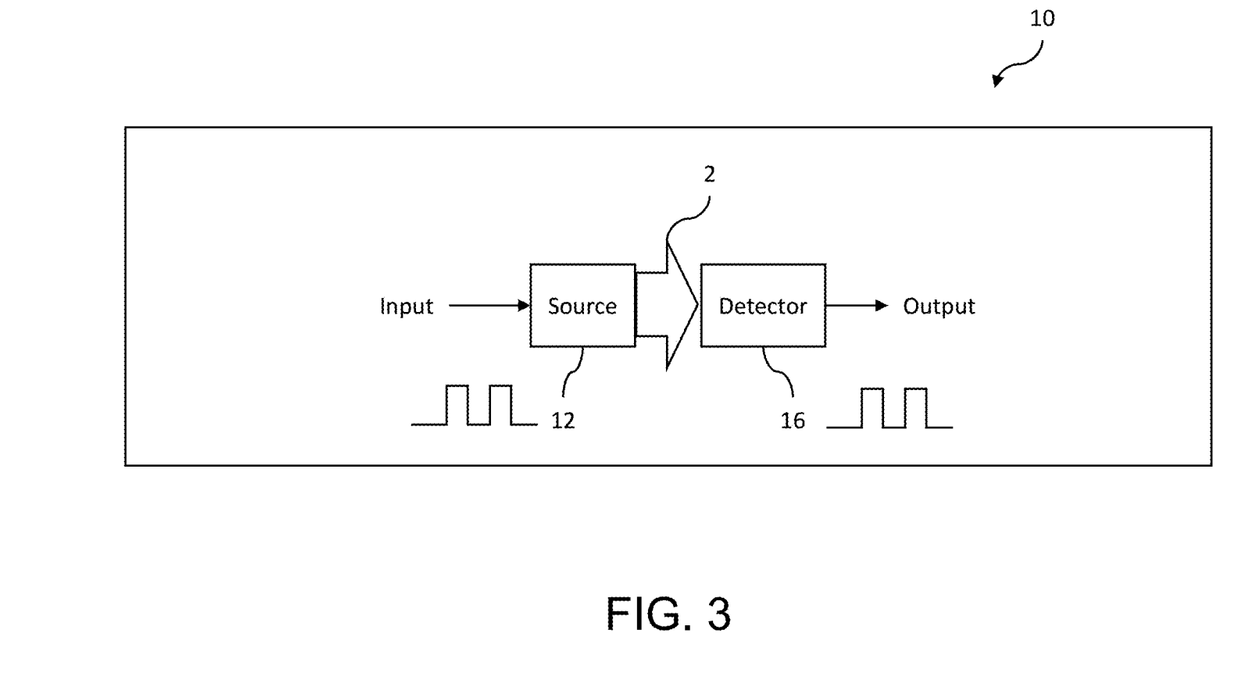
FIG. 3 is a block diagram of another configuration of the optical communication system in FIG. 1, in which a light source and light detector are co-located.

Optical signals or light are transmitted from the light source 12 to the light detector 16 via a transmission medium 14. In other words, the light source 12 encodes a message into an optical signal, which is carried via the transmission medium 14 to the light detector 16. In one embodiment of the optical data communication system 10, the light source 12 and the light detector 16 are connected by an optical fiber 4, as shown in FIG. 2. In another embodiment, the light source 12 and the light detector 16 are co-located, or in other words physically adjacent and separated by a gap 2 (e.g., free space, optically transparent couplant), as shown in FIG. 3, that can be spanned without having an optical fiber intermediary. These embodiments will be discussed in further detail below.

The light source 12 may include a light-emitting diode (LED) (e.g., GaN LED), laser diode, electron beam emitter (vacuum tube), or any combination thereof. Further, the light source 12 may generate light or electromagnetic emissions having a short wavelength of less than or equal to 500 nm (e.g., blue light, ultraviolet (UV) light, and X-ray). In order to detect the short wavelength light transmitted by the light source 12, the light detector 16 may be formed of one or more wide bandgap semiconductor materials. Such wide bandgap semiconductor materials can withstand high temperatures and harsh environments, such as SiC, gallium nitride (GaN)). Wide bandgap semiconductors permit devices to operate at much higher voltages, and temperatures, including temperatures greater than 250° C. Further, the light detector 16 may include a photodiode, phototransistor, a scintillator coupled to a photodetector, or any combination thereof. The light detector 16 may also include one or more photomultiplier tubes.

The optical data communication system 10 may include various configurations. As illustrated in FIG. 2, the light source 12 and the light detector 16 may be connected via a transmission medium 14 in the form of an optical fiber 4, or optically transparent couplant. The optical fiber 4 may be contained within a capillary tube to help protect the optical fiber 4 from physical material, such as dirt, ground, rain, or the like. The transmission medium 14 may include appropriate cladding materials (e.g., gold, polyimide) to operate in high temperatures and harsh environments. In another embodiment illustrated in FIG. 3, the light source 12 and the light detector 16 are co-located or physically adjacent, such that the transmission medium 14 is a gap 2 or free space, which can be spanned without having an optical fiber intermediary.

Turning again to FIG. 1, the light source 12, the light detector 16, the transmission medium 14, and the supporting components 18 are each capable of operating in high temperatures and harsh environments. The supporting components 18 may use silicon-on-insulator (SOI) or silicon carbide (SiC) technology and may include signal processing circuitry 20 (e.g., one or more sensors, sensing elements, or energy harvesting devices). In an embodiment, the light detector 16 and the signal processing circuitry 20 may be integrated on the same semiconductor chip or substrate, (e.g., a silicon carbide chip). In some embodiments, the supporting components 18 may include an optics component 22. The light source 12 may produce one or more light pulses into a transmission structure for transmission through the optics component 22.

The optics component 22 may include a variety of suitable optical processing components such as one or more: lenses, collimators, optical waveguides, variable attenuators, pump filters, erbium-doped fiber amplifiers (EDFAs), couplers, pulser components, mirrors (e.g., faraday mirrors), compensator components, discrete fiber-coupled devices, pump lasers, or the like. Furthermore, the optics component 22 may include combinations of the aforementioned components. For example, an EDFA may include one or more pumps lasers and one or more wavelength couplers, in addition to fiber-optic components such as a coil of erbium-doped fiber cable. After optical processing, light from the light source 12 may be transmitted to the light detector 16 via the transmission medium 14. Furthermore, the optics component 22 may be used to couple light from the transmission medium 14 to the light detector 16.

Although described as one optical communication path between the light source 12 and the light detector 16, it should be understood that the optical data communication system 10 may include one or more of each of the depicted components (e.g., light source 12, light detector 16, optical fiber 4) to provide one or more optical communication paths that may or may not be grouped together. Moreover, although a single light signal (e.g., light pulse) may be described herein, it should be understood that in operation one or more lights (e.g., light pulses) may be transmitted from the light source 12 to the light detector 16.

As mentioned above, the optical data communication system may include various configurations. As such, FIG. 2 depicts a configuration of the optical data communication system 10, in which the light source 12 and the light detector 16 are separated by a transmission medium 14, and the transmission medium 14 is one or more optical fibers 4. Data (e.g., digital voltage data, analog voltage data) is input into the light source 12 and an optical signal is generated by the light source 12, and then transmitted from the light source 12 to the light detector 16 via the optical fiber 4. The data transmitted via the optical fiber 4 may then be decoded by the detector 16 and output as digital voltage data or message.

FIG. 3 depicts another configuration of the optical data communication system 10, in which the light source 12 and the light detector 16 are galvanically isolated. In this configuration, the light source 12 transmits light to the light detector 16 via the transmission medium 14, where the transmission medium 14 is a gap 2 (e.g., optically transparent couplant, free space) without an optical fiber intermediary. In this configuration, the light source 12 and the light detector 16 are co-located, such that the light source 12 and the light detector 16 are physically adjacent to the gap 2 (e.g., free space).

In an embodiment, the gap 2 includes a substantially optically transparent dielectric (e.g., suitable effective insulation) between the light source 12 and the light detector 16. The physical separation between the light source 12 and the light detector 16 is selected to enable a desired dielectric withstand. The desired dielectric withstand may prevent dielectric breakdown in the presence of high voltage. In this embodiment, there is no direct conduction path. The gap 2 may be scaled for electrical (galvanic) isolation. The gap 2 may also be small in size. For example, the gap 2 may have a length (between the light source 12 and the detector 16) in the range of 0.1 mm to 5 mm (e.g., 0.1 mm, 1 mm, or 5 mm).

In some embodiments, light detector 16 of the optical data communication system 10, after receiving the signal, may be used to actuate a power module 24 (e.g., power transistor, or semiconductor switch). The power module 24 may also include one or more of the following components: a resistor, a diode, a bipolar junction transistor (BJT), a dielectric gap, insulated-gate bipolar transistor (IGBT), a thyristor, a gate driver, a SiC metal-oxide-semiconductor field-effect transistor (MOSFET), a GaN FET, and a GaN high electron mobility transistor (HEMT). The power module 24 may be used to control another component or device (not shown) outside of the optical data communication system 10 such as a motor, a power conversion module, and/or a power supply to another mechanical device such as a valve, fan, rotor, pump, actuator, etc.

In one embodiment, with respect to both configurations in FIGS. 2 and 3, a SiC photodiode may be used as the light detector 16. In this embodiment, there may be two primary methods of amplifying the signal. In one method, the SiC photodiode may include a built-in detector gain, by operating in an avalanche mode or regime, in which photons are received and electrons are outputted in a cascading manner. In doing so, the signal is amplified, without the use of a separate amplification component or circuit. The second method adds one or more optional amplifier circuits or amplifier components 26 to the light detector 16. This occurs using monolithic integration on the same semiconductor substrate or by using a heterogenous integration platform (e.g., silicon interposer and/or ceramic substrate). As such, the detector 16 and the amplifier component 26 may be fabricated on the same semiconductor substrate, which may yield a reduction in manufacturing costs. In addition, the amplifier component 26 may be for example, SOI or SiC device.

In another embodiment, a GaN photodetector may be used as the light detector 16. In a further embodiment, an aluminum gallium nitride (AlGaN) photodiode may be used as the light detector 16. AlGaN photodiodes may have tunable wavelengths that overlap based on the ratio of Aluminum (Al) to Gallium (Ga). Wavelength overlap may be adjusted or improved based on tuning emissions spectrum associated with the light source 12 to the optically sensitive regions associated with the light detector 16. Furthermore, wavelength tuning can be used to operate the data communication system 10 with multiple wavelengths sharing the same transmission medium 14, creating multiple data channels and either allow overall higher data rates or simultaneous communication between multiple pairs of light sources 12 and light detectors 16. Along with SiC and GaN, AlGaN can operate in high temperatures and harsh environments and is compatible with light associated with short wavelength (e.g., less than 500 nm).

The optical communication configuration of FIG. 2 and the optical isolation configuration of FIG. 3 may both be useful in a distributed system with smart components. In particular, optical cables used in the optical data communication system 10 may be advantageous over electrical cables used in traditional systems in terms of EMI immunity power, size, and weight. In communication systems with electrical cables, transient voltage suppressors may be used to protect electronic components from electrical nodes with high EMI or lightning. These suppressors may have large capacitances, which would add load to electrical cables, thereby reducing communication speeds. However, since the optical data communication system 10 may utilize optical cables (e.g., optical fiber 4), electrical protection may be omitted from the cables as the optical cables are not electrically conductive. As a result, the communication speed associated with optical cables may not be interfered with. Further, optical cables may not be susceptible to EMI leakage unlike electrical cables.

Additionally, optical cables are more efficient compared to electrical cables, particularly in harsh environments that include high noise environments where using low power is efficient. In such high noise environments, a traditional communication system with electrical components may use electrical high-speed line drivers to drive the electrical cables, thus using a greater amount of power compared to an optical communication system. For example, an optical cable may send optical power to a low energy device such as a sensor within the supporting components 18 in the optical data communication system 10. The supporting components 18 may be coupled to and/or in communication with the light source 12 and the supporting components 18. The supporting components 18 harvest the energy from the light source 12 and powers the light detector 16 and supporting components 18, thereby eliminating a separate electrical connection to power the devices on the light detector side. In one embodiment, a single optical cable may enable sending power to the sensor and reading the data measured from the sensor. In another embodiment, one optical cable may send power to the sensor while another optical cable may read the data measured from the sensor.

In a further embodiment, the optical communication configuration of FIG. 2 may include the light detector 16 (e.g., photodiode, photodetector) being permanently attached to the optical fiber 4. According to this embodiment, the electrical connector may reside in the electrical domain. In some embodiment, optical signals associated with both configuration in FIGS. 2 and 3 may include optically triggered devices that may be associated with discrete actuation, pulsed systems, remotely turning on or off the devices in the optical data communication system 10, and so forth. For example, a sensor disposed in the optical data communication system 10 may be turned on when measurement is desired. On the other hand, sensor disposed in the optical data communication system 10 may be turned off when measurements are not desired. Furthermore, data associated with both configurations may be signal encoded (e.g., zero mean encoding) to facilitate clock recovery, self-timed operation, baseline tracking, and different coding schemes (e.g., pulse position modulation, pulse width modulation, pulse frequency modulation). Signal encoding of data may be useful in high temperature or harsh environments where processing power may be limited or there is a high level of noise on the signal.

Figure 4:
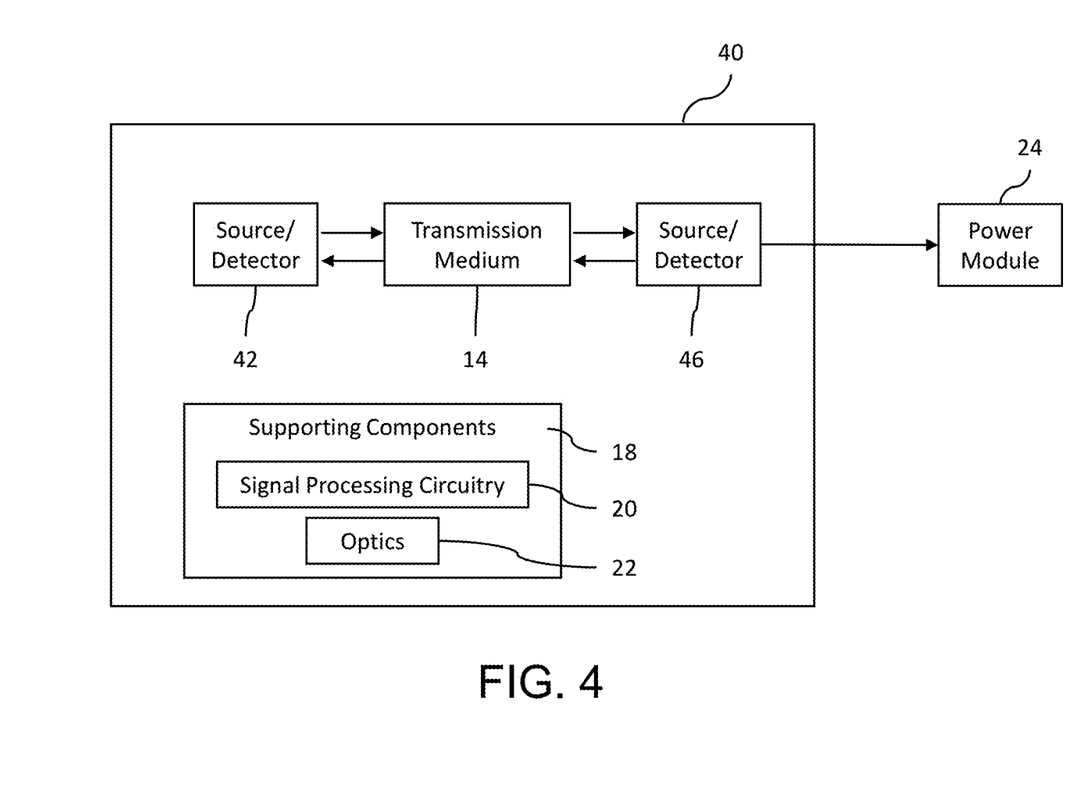
FIG. 4 is a block diagram of another embodiment of an optical communication system in which the light source and the light detector are capable of dual mode operation, such that bidirectional communication is enabled.

FIG. 4 illustrates another embodiment of an optical communication system 40. In this configuration, the same type of dual mode devices may be used as the light source 42 and the light detector 46, and data communication using these devices may be bi-directional. The operation of each of the dual mode components 42, 46, depends on the direction of signal transmission. For example, when an optical signal is transmitted from left to right, the source/detector 42 operates as a light source, and the source/detector 46 acts as a light detector. Conversely, when the signal transmission is reversed from right to left, the source/detector 46 acts as the light source and the source/detector 42 acts as a light detector. In both signal communication directions, the same transmission medium 14 is utilized. In addition, as described with respect to FIGS. 2 and 3, the transmission medium 14 may be a gap 2 or an optical fiber 4.

In both configurations of the system 40 of FIG. 4, namely with or without an optical fiber as the transmission medium 14, communication may be optimized for one direction but not optimized for the other direction. For example, data communication from the source 42 to the detector 46 may be more optimized compared to data communication from the detector 46 to the light source 42, and vice versa. Moreover, in system 40, a coupling from the optical fiber 4 as the transmission medium 14 to the light detector 46 (e.g., photodetector and photodiode) may be lensed or not lensed.

Figure 5:
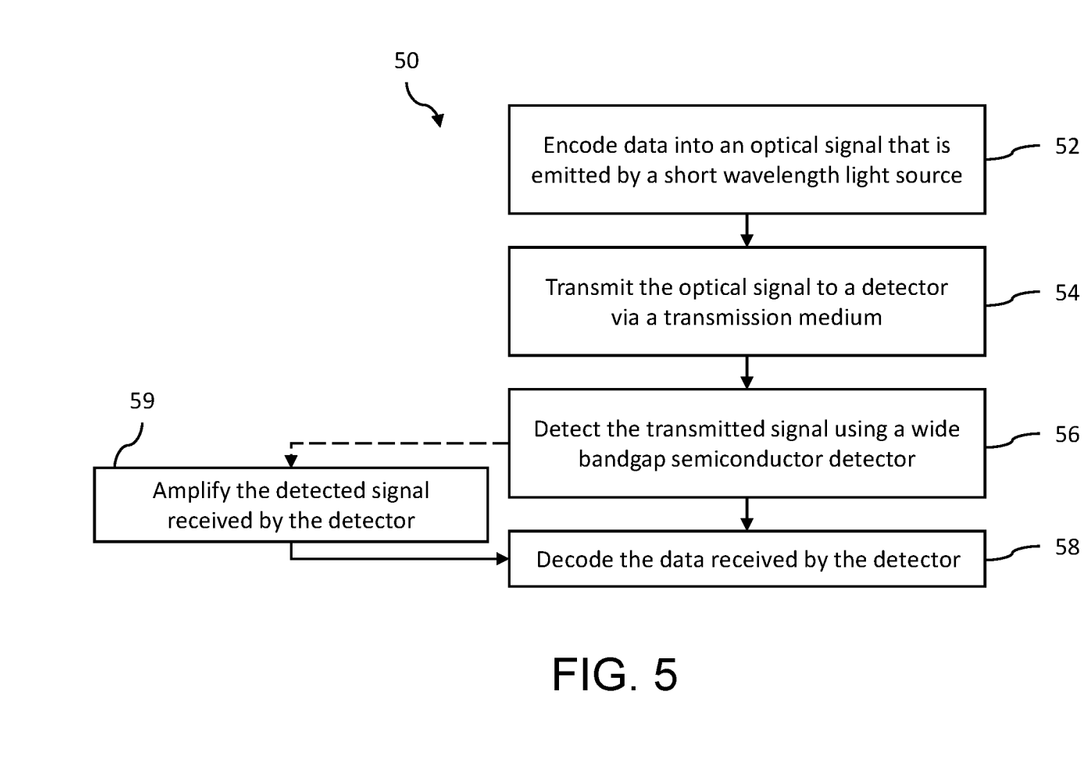
FIG. 5 is a flow diagram of a method of transmitting an optical signal, according to some embodiments.

FIG. 5 is a flow diagram of an exemplary method 50 of transmitting an optical signal in a high temperature environment. The method 50 includes the step of encoding 52 data into an optical signal that is emitted by a short wavelength light source or emitter. The method 50 also includes transmitting 54 the optical signal to a detector via a transmission medium. The method 50 further includes the step of detecting 56 the optical signal using a wide bandgap semiconductor as the detector. The method 50 also include decoding 58 the data received by the detector. The method 50 may include an optional step of amplifying 59 the optical signal received by the detector, after the signal is detected 56, but prior to it being decoded 58. The amplification step 59 may be performed using the avalanche mode of the detector or using a separate amplifier component or circuit within the detector. The method 50 may also include using the detector to actuate a semiconductor switch 26 as previously described. Other components of the embodiments herein may also be utilized to perform various steps of the embodiments of the systems 10 and 40 or as otherwise described herein.

Figure 6:
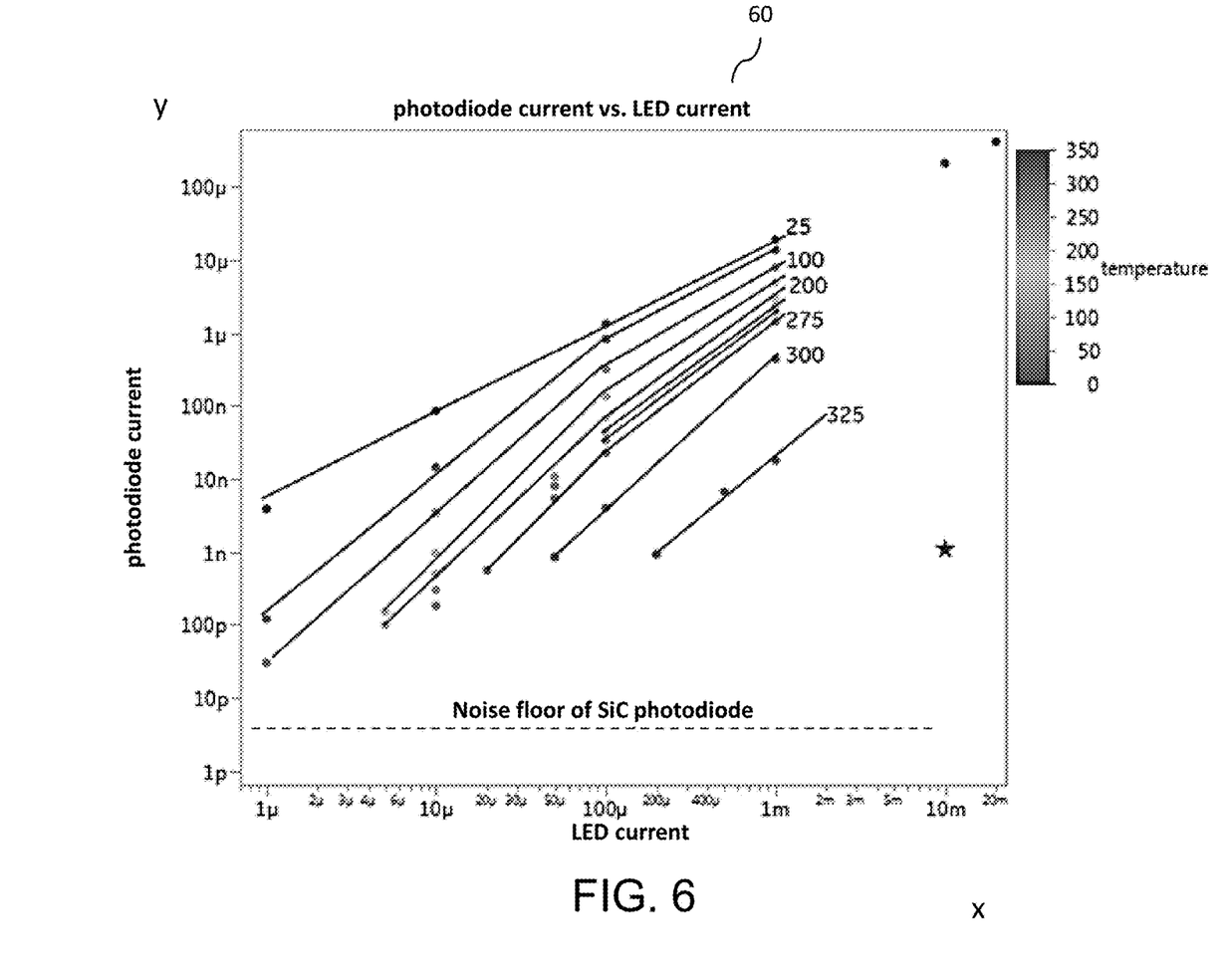
FIG. 6. is a graph illustrating optical signal degradation test data as a function of temperature using an exemplary optical communication system, without an optical fiber according to an embodiment.

FIGS. 6 and 7 show exemplary test data of optical communication systems using a SiC photodiode as the light detector 16. The x-axis of both graphs 60 and 70 are the light source intensity (in terms of LED current input). The y-axis of graphs 60 and 70 are the amount of photocurrent received by the SiC photodiode. Turning to FIG. 6, graph 60 illustrates exemplary test data for an optical signal received by the detector for an embodiment of a configuration of an optical communication system 10 illustrated in FIG. 3. As provided in FIG. 6, the graph 60 shows that the current output of the signal transmitted by the communications system decreases with higher ambient temperature. As provided in the exemplary test data, the signal level achieved remains useful up to approximately 325 degrees C. In other words, relative to the noise floor of the SiC photodiode illustrated by the horizontal dotted line, the signal value output is capable of being decoded within an acceptable signal to noise ratio. These test data of FIG. 6 is provided for illustration only and does not limit the capabilities of the system embodiments herein to the signal to noise ratios or operating temperatures provided in FIG. 6.

Some of the benefits and advantages associated with the embodiments herein include, but are not limited to, providing data communication systems that are low-weight, have reduced susceptibility to lightning damage, and are capable of operating in high temperatures and harsh environments. As such, the embodiments herein are useful for industrial applications, for example, applications using distributed control systems (e.g., aircrafts, satellites). In addition, the use of wide bandgap devices for the embodiments of the emitters and the detectors herein enables operation in the blue to UV light spectrum. Accordingly, the rate of signal transmission or communication speed may be in the range of at or around 2 Mbps, and within a range of 100 Kbps-50 Mbps or higher depending on the operating temperature.

Further aspects of the invention are provided by the subject matter of the following clauses:

1. An optical data communication system comprising: a light source for emitting electromagnetic emissions; a transmission medium for transmitting the electromagnetic emissions from the light source; and a detector for detecting the electromagnetic emissions from the transmission medium, wherein the detector comprises a wide bandgap semiconductor material.

2. The system of any preceding clause, wherein electromagnetic emissions have a wavelength of less than or equal to 500 nm.

3. The system of any preceding clause, wherein the light source is formed from a wide bandgap semiconductor.

4. The system of any preceding clause, wherein the transmission medium comprises an optical fiber.

5. The system of any preceding clause, wherein the light source and the detector are physically adjacent to a dielectric gap that is spanned, without having an optical fiber intermediary.

6. The system of any preceding clause, wherein the wide bandgap semiconductor material is configured to include one or more of: a SiC photodetector, a GaN photodiode, and an AlGaN photodiode.

7. The system of any preceding clause, wherein the detector further comprises an amplifier component for amplifying the electromagnetic emissions received by the detector.

8. The system of any preceding clause, wherein the detector is further configured to operate in an avalanche mode such that the electromagnetic emissions are amplified without the use of a separate amplification component.

9. The system of any preceding clause, wherein the electromagnetic emissions are capable of being decoded when the system is operating in an environment having a temperature at or above 125° C.

10. The system of any preceding clause, wherein the detector is configured to actuate a power module.

11. The system of any preceding clause, wherein the detector and the light source are each configured to operate in a dual mode that enables the system to perform bi-directional communication.

12. The system of any preceding clause, wherein the light source and the detector are galvanically isolated.

13. A method of transmitting an optical signal in a high temperature environment, the method comprising: encoding data into an optical signal that is emitted by an emitter; transmitting the optical signal to a detector via a transmission medium; and detecting the optical signal using a detector, wherein the detector comprises one or more wide bandgap semiconductor materials.

14. The method of any preceding clause wherein, the method further comprising: decoding the optical signal received by the detector.

15. The method of any preceding clause, the method further comprising: amplifying the optical signal using an amplifier component within the detector, prior to decoding.

16. The method of any preceding clause, the method further comprising: amplifying the optical signal using an avalanche mode of the detector, prior to decoding.

17. The method of any preceding clause, the method further comprising: actuating a semiconductor switch using the detector.

18. The method of any preceding clause, wherein the semiconductor switch is a SiC MOSFET device.

19. The method of any preceding clause, wherein the transmission medium comprises a dielectric gap, without an optical fiber intermediary between the emitter and the detector.

20. The method of any preceding clause, wherein the transmission medium is a fiber optic cable.

One or more specific embodiments of the present disclosure are described herein. In order to provide a concise description of these embodiments, all features of the actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. One or more specific embodiments of the present embodiments described herein will be described below. In an effort to provide a concise description of these embodiments, all features of an actual implementation may not be described in the specification.

This written description uses examples to disclose embodiments of the invention, including the best mode, and also to enable any person skilled in the art to practice embodiments of the invention, including making and using any devices or systems and performing any incorporated methods. The scope of the invention includes the examples provided herein and other examples that may occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An optical data communication system comprising:
   a light source for emitting electromagnetic emissions,
      wherein the electromagnetic emissions are capable of being decoded when the system is operating in an environment having a temperature at or above 125° C.;
   a transmission medium for transmitting the electromagnetic emissions from the light source;
   an amplifier component for amplifying the electromagnetic emissions received by a detector,
      wherein the amplifier component comprises a silicon carbide (SiC) device; and
   the detector for detecting the electromagnetic emissions from the transmission medium,
      wherein the detector comprises a SiC photodetector with a wide bandgap;
   wherein the light source and the detector are spaced a selected distance from one another to achieve a desired dielectric withstand to be scaled for galvanic isolation.

2. The system of claim 1, wherein the transmission medium is further for transmitting electromagnetic emissions that have a wavelength of less than or equal to 500 nm.

3. The system of claim 1, wherein the light source is formed at least in part from a wide bandgap semiconductor material.

4. The system of claim 1, wherein the transmission medium comprises an optical fiber.

5. The system of claim 1, wherein the light source and the detector are physically adjacent to a dielectric gap that is spanned without having an optical fiber intermediary.

6. The system of claim 1, wherein the detector is further configured to operate in an avalanche mode such that the electromagnetic emissions are amplified without the use of a separate amplification component.

7. The system of claim 1, wherein the detector is configured to actuate a power module.

8. The system of claim 1, wherein the detector and the light source are each configured to operate in a dual mode that enables the system to perform bi-directional communication.

9. A method of transmitting an optical signal in a high temperature environment, the method comprising:
   encoding data into an optical signal that is emitted by an emitter;
   transmitting the optical signal to a detector via a transmission medium;
   amplifying the optical signal received by the detector using an amplifier component,
      wherein the amplifier component comprises a silicon carbide (SiC) device; and
   detecting the optical signal using the detector,
      wherein the detector comprises a SiC photodetector with a wide bandgap,
   wherein the optical signal emitted is capable of being decoded when the emitter, the detector, the amplifier component, and the transmission medium are operating in an environment having a temperature at or above 125° C.,
   wherein the emitter and the detector are spaced a selected distance from one another to achieve a desired dielectric withstand to be scaled for galvanic isolation.

10. The method of claim 9, the method further comprising: decoding the optical signal received by the detector.

11. The method of claim 10, the method further comprising: amplifying the optical signal using an avalanche mode of the detector, prior to decoding.

12. The method of claim 9, the method further comprising: actuating a semiconductor switch using the detector.

13. The method of claim 12, wherein the semiconductor switch is a SiC MOSFET device.

14. The method of claim 9, wherein the transmission medium comprises a dielectric gap, without an optical fiber intermediary between the emitter and the detector.

15. The method of claim 9, wherein the transmission medium is a fiber optic cable.

\* \* \* \* \*

UNITED STATES PATENT AND TRADEMARK OFFICE
CERTIFICATE OF CORRECTION

| | | |
|---|---|---|
| PATENT NO. | : 11,398,870 B2 | Page 1 of 1 |
| APPLICATION NO. | : 17/189040 | |
| DATED | : July 26, 2022 | |
| INVENTOR(S) | : Cheng-Po Chen and Emad A. Andarawis | |

It is certified that error appears in the above-identified patent and that said Letters Patent is hereby corrected as shown below:

On the Title Page

Column 1, (71) Applicant, delete "GE AVIATION SYSTEMS LLC, Grand Rapids, MI (US)" and insert -- General Electric Company, Schenectady, NY (US) --.

Signed and Sealed this
Eighteenth Day of October, 2022

Katherine Kelly Vidal
*Director of the United States Patent and Trademark Office*